US011925005B2

(12) United States Patent
Fowler

(10) Patent No.: US 11,925,005 B2
(45) Date of Patent: Mar. 5, 2024

(54) SYSTEMS AND METHODS FOR PNEUMATIC RELEASE MANIFOLD SEALING

(71) Applicant: Eagle Technology, LLC, Melbourne, FL (US)

(72) Inventor: Clarke O. Fowler, Merritt Island, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 156 days.

(21) Appl. No.: 17/665,088

(22) Filed: Feb. 4, 2022

(65) Prior Publication Data
US 2023/0255003 A1    Aug. 10, 2023

(51) Int. Cl.
*H05K 7/20* (2006.01)

(52) U.S. Cl.
CPC ..... *H05K 7/20772* (2013.01); *H05K 7/20272* (2013.01)

(58) Field of Classification Search
CPC ........... H05K 7/20772; H05K 7/20272; H05K 7/20563; H05K 7/1404
See application file for complete search history.

(56) References Cited

U.S. PATENT DOCUMENTS

| | | | | |
|---|---|---|---|---|
| 4,829,402 A * | 5/1989 | Gewebler | ............ | H05K 7/1404 361/802 |
| 5,813,876 A * | 9/1998 | Rutigliano | ......... | G01R 31/2808 439/260 |
| 5,835,349 A | 11/1998 | Giannatto et al. | | |
| 9,466,551 B1 * | 10/2016 | Reist | .................... | F28D 15/0241 |
| 2003/0223197 A1 * | 12/2003 | Hulan | .................. | H05K 7/1404 257/713 |
| 2007/0070601 A1 * | 3/2007 | Vos | ....................... | H05K 7/1404 361/694 |
| 2007/0253169 A1 * | 11/2007 | Clawser | ............. | H05K 7/20545 361/720 |
| 2011/0058335 A1 * | 3/2011 | Sullivan | ............. | H05K 7/20709 361/704 |
| 2015/0201527 A1 * | 7/2015 | Stringer | ............. | H05K 7/20254 165/80.3 |
| 2017/0248994 A1 * | 8/2017 | Pruett | ....................... | G06F 1/20 |

* cited by examiner

*Primary Examiner* — James Wu
*Assistant Examiner* — Christopher L Augustin
(74) *Attorney, Agent, or Firm* — Fox Rothschild LLP; Carol Thorstad-Forsyth

(57) ABSTRACT

Systems and methods. The methods comprise: causing bellows to transition from expanded states to collapsed states by removing a first fluid therefrom (the bellows being coupled to opposing sidewalls of a chassis configured to structurally support at least one circuit card); receiving the at least one circuit card in a cavity of the chassis; causing the bellows to transition from the collapsed states to at least partially expanded states by allowing the first fluid to enter the bellows; applying a pushing force by each said bellow to an intermediary structure disposed between the bellow and the circuit card; and creating a seal between the intermediary structure and the circuit card when the bellow is in the at least partially expanded state.

18 Claims, 11 Drawing Sheets

SYSTEMS AND METHODS FOR PNEUMATIC RELEASE MANIFOLD SEALING

BACKGROUND

Statement of the Technical Field

The present document concerns electronic systems. More specifically, the present document concerns implementing systems and methods for pneumatic release manifold sealing.

Description of the Related Art

Many communications systems, especially those intended for use in mobile platforms, must be environmentally robust both in terms of their hardware and signaling format. Airborne communication systems used with a plurality of UHF line-of-sight and satellite links, for example, may incorporate a transceiver mounting chassis or enclosure containing diverse communication equipment such as RF transmitter modules, RF receiver modules and various digital signal processing modules which control operation of the RF components and interface digital communications signals with attendant encryption and decryption circuits. Considering that each communication link has its own dedicated signaling scheme, suppliers of this equipment typically provide each system as an integrated unit.

One of the standard architectures employed by suppliers of such systems is the Versa Module Europa or VME bus. RF signaling circuits and digital signaling modules plug into discrete connector slots on the VME bus to avoid crosstalk and provide isolation between such components, and, to conform with the relatively tight dimensional spacing between the connector slots on the VME bus. Whether the communication system is intended for use in a mobile platform as noted above, or other applications, the enclosure or chassis which houses the VME bus and communication equipment components must be designed to withstand harsh environmental conditions including vibration, temperature variations and exposure to foreign matter. Consequently, VME bus specifications mandate ruggedized housing architectures which have the ability to cool circuit components and protect them from exposure to excess vibration and foreign material.

Initial efforts to meet VME bus specifications included chassis designs incorporating expensive and complex heat transfer elements. Alternatively, or in addition to these measures, the circuit card assemblies were provided with special, thermally robust circuit elements which added cost and unwanted bulk to the design.

These deficiencies were addressed to some extent in the system disclosed in U.S. Pat. No. 5,835,349 to Giannatto et al. ("The '349 Patent"). This patent discloses a housing and cooling assembly which reduces the cost and overall size of the unit, while providing effective cooling of circuit components on the circuit card assemblies. A "U-pass" heat exchanger is mounted directly to each individual circuit card assembly which imparts structural rigidity to the cards and isolates the circuit cards from the flow of cooling fluid, e.g. air, passing through the heat exchanger in a U-shaped flow path to and from an inlet/exhaust plenum. The circuit card assembly of each circuit card/heat exchanger combination or module is plugged into the VME bus, while the inlet and outlet of the heat exchanger is sealed with a gasket to elements of the chassis.

While the system of the '349 Patent provides a number of advantages over prior approaches, it nevertheless has some limitations. Cooling air from outside of the heat exchanger circulates from the inlet of the plenum to the opposite end of the heat exchanger, and then reverses direction in order to flow to the exhaust portion of the same plenum. This U-shaped flow path creates a relatively large pressure drop that reduces the heat transfer performance of the heat exchanger. Additionally, the use of a gasket to seal the inlet and outlet of the heat exchanger reduces the reliability of the system and creates a maintenance issue since the gaskets can be easily damaged and may require periodic replacement. Further, the circuit card/heat exchanger modules are provided with rails at each end which engage opposed slots formed in the end walls of the chassis to mount them in place. In order to readily permit installation of the modules in the chassis, the mating rails and slots cannot be constructed with tolerances which are too tight, and therefore the overall rigidity of the assembly is sacrificed to some extent and tolerance to vibration is reduced.

SUMMARY

This document concerns systems and methods. The methods comprising: causing bellows to transition from expanded states to collapsed states by removing a first fluid therefrom (the bellows being coupled to opposing sidewalls of a chassis configured to structurally support circuit card(s)); receiving the circuit card(s) in a cavity of the chassis; causing the bellows to transition from the collapsed states to at least partially expanded states by allowing the first fluid to enter the bellows; applying a pushing force by each bellow to an intermediary structure disposed between the bellow and the circuit card(s); creating a seal between the intermediary structure and the circuit card(s) when the bellow is in the at least partially expanded state; and/or cooling the circuit card(s) by causing a second fluid to flow between the opposing sidewalls of the chassis via the bellows, the intermediary structure and the at least one circuit card.

The first fluid may be removed from the bellows using a vacuum. The intermediary structure comprises aperture(s) through which a first amount of the second fluid can flow. A size or shape of the aperture(s) may be changed to allow a different second amount of the second fluid to flow through the intermediary structure. Accordingly, in some scenarios, the methods also comprise: coupling fluid flow control member(s) to a plate to form the intermediary structure (the fluid flow control member(s) have a first aperture); and replacing the fluid flow control member(s) with other fluid flow control member(s) that (i) has(have) second aperture(s) with shape(s) and/or size(s) different than a shape or size of the first aperture.

In those other scenarios, compression stop(s) of the intermediary structure is(are) used to limit an amount of compression of sealing member(s) (e.g., elastomeric gasket(s)) creating the seal. Additionally or alternatively, each bellow has an amount of expansion that varies from a first end to a second opposing end when in the at least partially expanded state. The variation in the amount of expansion may be caused by a tapered sidewall of the circuit card(s).

The implementing systems can comprise an electronic cooling apparatus. The electronic cooling apparatus comprises: a chassis having a plurality of sidewalls defining a cavity in which at least one circuit card is receivable; and pneumatic release manifold sealing system(s). The pneumatic release manifold sealing system comprises: a bellow having a first side coupled to a sidewall of the plurality of sidewalls and configured to (i) transition from an expanded state to a collapsed state via removal of a first fluid therefrom and (ii) transition from the collapsed state to the expanded state when the first fluid is no longer being removed therefrom; an intermediary structure coupled to a second side of the bellow such that the bellow is able to apply a pushing force on the intermediary structure when transitioning from the collapsed state; and a sealing member configured to create a seal between the intermediary structure and the at least one circuit card as the bellow is transitioning from the collapsed state.

The first fluid may be removed from the bellow using a vacuum. The electronic cooling apparatus may also comprise: compression stop(s) configured to limit an amount of compression of the sealing member when creating the seal; and/or a fan configured to cause a second fluid to flow from the sidewall and through the bellow, the intermediary structure and the at least one circuit card.

In some scenarios, the intermediary structure comprises aperture(s) through which a first amount of the second fluid can flow. A size and/or shape of the aperture(s) is changeable to allow a different second amount of the second fluid to flow through the intermediary structure.

In those or other scenarios, the intermediary structure comprises a plate with fluid flow control member(s) coupled thereto. The fluid flow control member(s) have first aperture(s). The fluid flow control member(s) is(are) replaceable by other fluid flow control member(s) that has(have) second aperture(s) with a shape or size different than a shape or size of the first aperture(s). Additionally or alternatively, the bellow has an amount of expansion that varies from a first end to a second opposing end when in an at least partially expanded state.

BRIEF DESCRIPTION OF THE DRAWINGS

This disclosure is facilitated by reference to the following drawing figures, in which like numerals represent like items throughout the figures.

DETAILED DESCRIPTION

Figure 1:
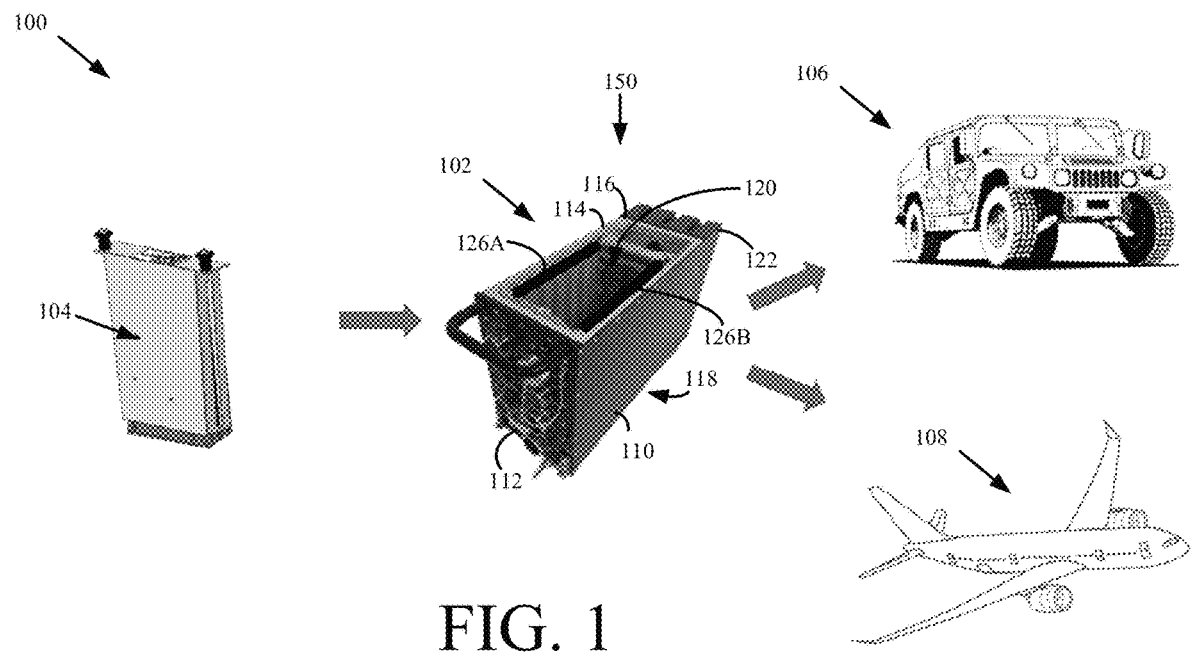
FIG. 1 provides an illustration of a system.

It will be readily understood that the solution described herein and illustrated in the appended figures could involve a wide variety of different configurations. Thus, the following more detailed description, as represented in the figures, is not intended to limit the scope of the present disclosure but is merely representative of certain implementations in different scenarios. While the various aspects are presented in the drawings, the drawings are not necessarily drawn to scale unless specifically indicated.

Reference throughout this specification to features, advantages, or similar language does not imply that all the features and advantages that may be realized should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

A highly dense electronic package results in difficult thermal management issues. In such packaging, electronic components exceed their thermal design limits and parts display reduced reliability well before the maximum temperature limits. Current thermal management methods typically involve conduction cooling with ultimate heat rejection to air. Air flows in enclosed chassis systems are usually low with heat transfer coefficients creating a thermal bottleneck. Typical ambient air temperatures are up to approximately 55° C., which results in Printed Wiring Board (PWB) temperatures 30° C.-40° C. above the ambient temperature. Component junction temperatures may exceed 150° C. The present solution overcomes the drawbacks of conventional thermal management methods.

The present solution generally concerns systems and methods for housing and cooling circuit card assemblies employed in communication and other electronic systems. The systems comprise a chassis having a cavity defined by a plurality of sidewalls. Two of the sidewalls have a pneumatic release manifold sealing system coupled thereto. The pneumatic release manifold sealing system is designed to facilitate retention and fluid-based (e.g., air-based) cooling of the circuit cards disposed on the chassis. The pneumatic release manifold sealing system will be described in detail below.

The present solution will be described below in relation to an electronic chassis (e.g., Air Transport Rack (ATR)) applications. The present solution is not limited in this regard and can be employed in other terrestrial and avionics applications.

Referring now to FIG. 1, there is provided an illustration of an illustrative system 100 implementing the present solution. System 100 comprises an electronic cooling apparatus 150 having a chassis 102 in which circuit card(s) 104 can be disposed and housed. The chassis 102 may be carried in a vehicle. The vehicle can include, but is not limited to, land vehicles 106, aircraft 108, watercraft (not shown), subterrenes (not shown) and/or spacecraft.

The chassis 102 comprises a cavity 120 defined by sidewalls 110-116 and a bottom wall 118. A cover (not shown) can be provided to close and/or otherwise seal the cavity 120. A pneumatic release manifold sealing system 126A, 126B (collectively referred to as "126") is provided on both sidewalls 110 and 114. The pneumatic release manifold sealing systems 126 facilitate (i) a guided insertion of circuit cards(s) 104 into the cavity 120, (ii) an alignment of the circuit cards in a parallel arrangement, (iii) the retention of the circuit cards 104 within the cavity 120, and/or (iii) the cooling of the circuit cards 104 during use.

The sidewalls 110, 114 are hollow structures through which a fluid is caused to flow. For example, air is caused to flow through the sidewalls 110, 114 via a fan 122 coupled to the chassis 102. Apertures are formed in the pneumatic release manifold sealing systems 126 and the circuit cards. In effect, the fluid also flows through these components whereby heat is transferred from the circuit cards to the air. The heated air is caused to travel out of the chassis and mix with ambient air. In this way, temperatures of the circuit cards can be maintained within their thermal design limits.

Figure 2:
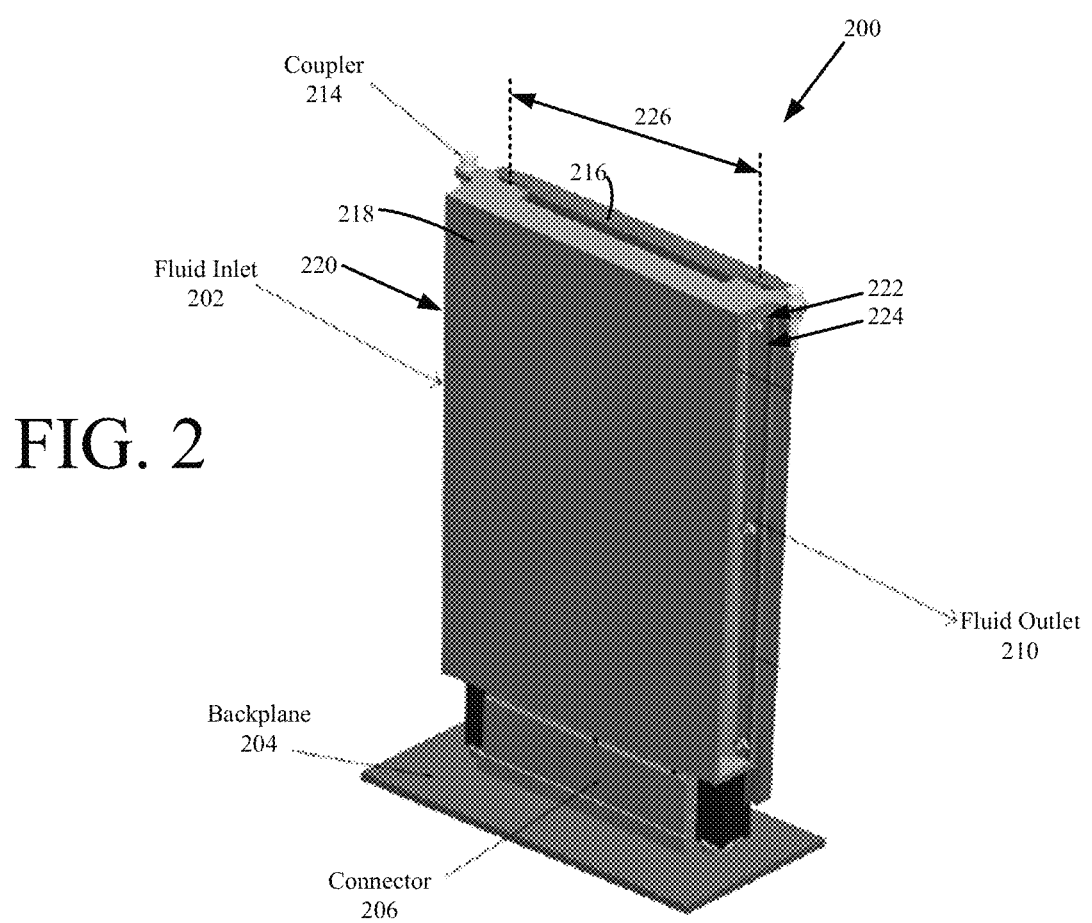
FIG. 2 provides a perspective view of the circuit card shown in FIG. 1 coupled to a backplane or mother board.

Referring now to FIG. 2, there is provided a perspective view of a circuit card 200 coupled to a backplane 204. Circuit card(s) 104 of FIG. 1 can be the same as or similar to circuit card 200. The backplane 204 may comprise a mother board configured to facilitate communications between two or more circuit cards coupled thereto and/or facilitate communications between the circuit card(s) and external device(s). Backplanes and mother boards are well known. The backplane 204 may be securely disposed in a cavity (e.g., cavity 120 of FIG. 1) of a chassis (e.g., chassis 102 of FIG. 1). The backplane 204 comprises a plurality of electrical connectors 206 which mate with electrical connectors (not visible in FIG. 2) provided with the circuit cards.

The circuit card 200 has a PWB 216 coupled to a cooling structure 218. The cooling structure 218 has sidewalls 220, 222 with apertures 224 formed therein. One of the apertures defines a fluid inlet 202, while the other aperture defines a fluid outlet 210. A hollow cavity is provided between the fluid inlet and outlet. As such, a cooling fluid (e.g., air) can flow across a width 226 of at least the PWB 216 when the circuit card 200 is disposed in a chassis.

Once fully inserted in the chassis, the circuit card 200 can be removably coupled to the chassis sidewalls using couplers 214. Couplers 214 can include, but are not limited to, threaded screws or bolts that mate with threaded holes (e.g., threaded holes 400 of FIG. 4) formed in the chassis sidewalls (e.g., sidewalls 110, 114 of FIG. 1).

Figure 3:
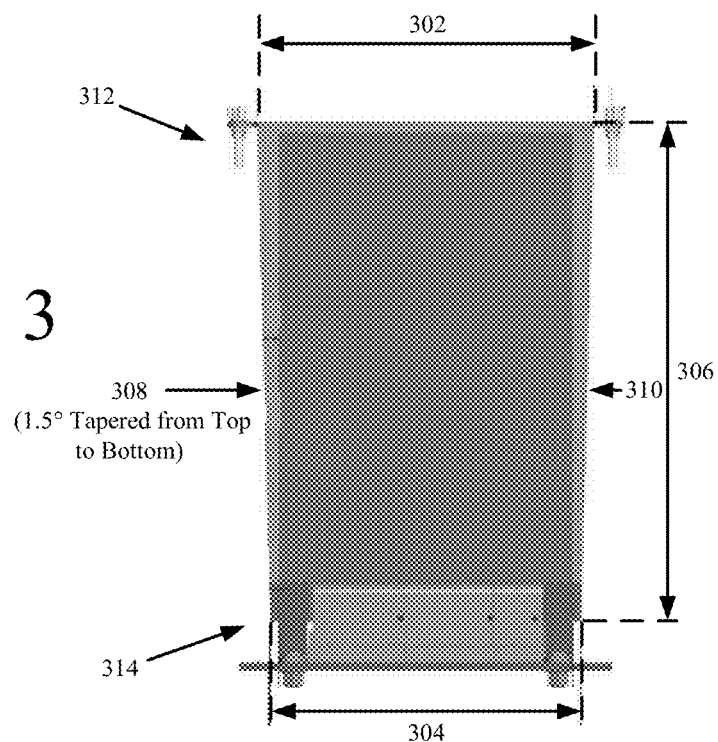
FIG. 3 provides a front view of the circuit card shown in FIGS. 1-2.

A front view of the circuit card 200 is provided in FIG. 3. As shown in FIG. 3, the width of the circuit card 200 varies along its height 306. This is because sidewalls 308, 310 are tapered (e.g., by 1.5°) from a top (or first) end 312 to a bottom (or second) end 314. This tapering of sidewalls 308, 310 provides challenges with being able to effectively cool the circuit card 200 when disposed in a chassis (e.g., chassis 102 of FIG. 1). The pneumatic release manifold sealing systems 126 of the present solution are designed to address these challenges.

Figure 4:
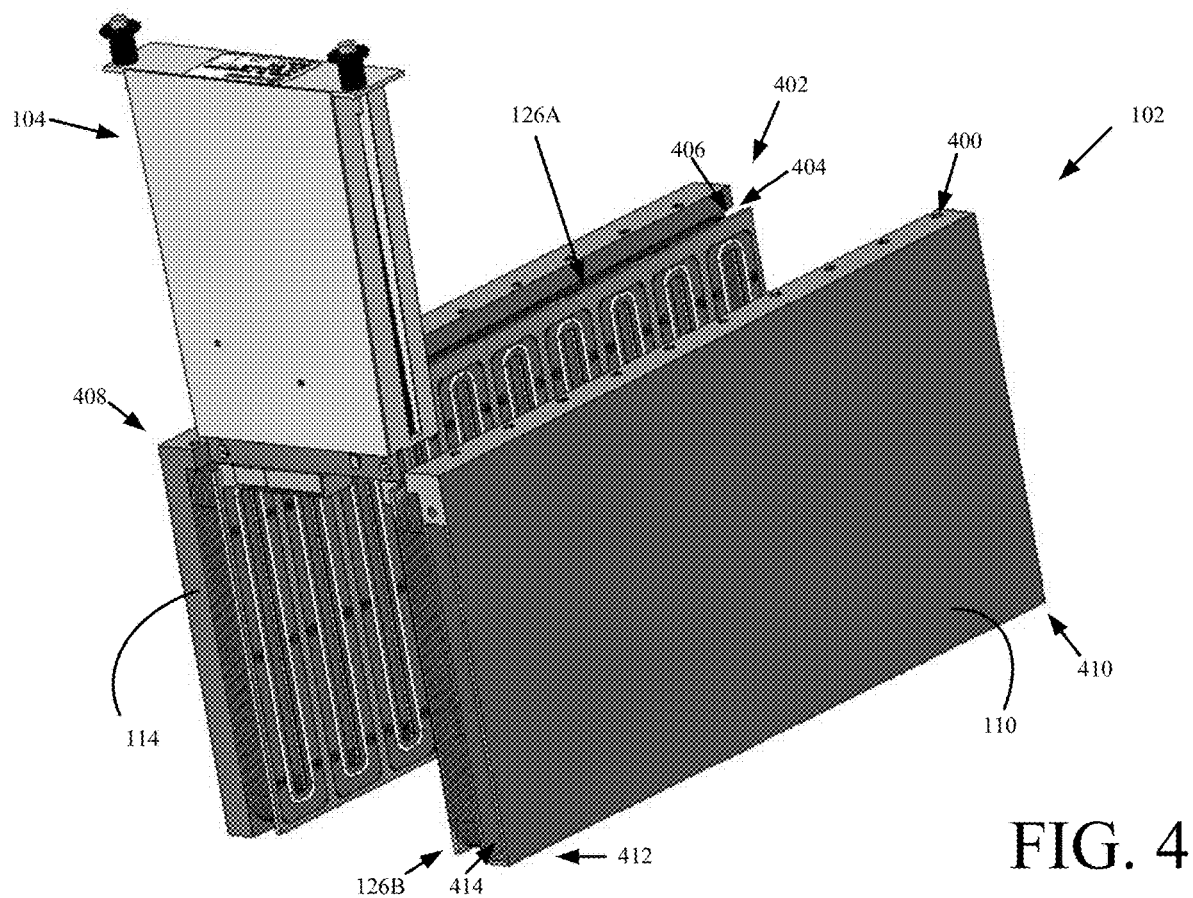
FIG. 4 provides a perspective view of the circuit card being disposed in a chassis (with the front, back and bottom sidewalls removed for clarity of illustration).

Referring now to FIG. 4, there is provided an illustration showing the circuit card 104 being disposed in the chassis 102 of FIG. 1. Chassis walls 112, 116, 118 are not shown in FIG. 4 to facilitate an understanding of the pneumatic release manifold sealing systems 126. A first pneumatic release manifold sealing system 126A is coupled to sidewall 114 of the chassis 102, and a second pneumatic release manifold sealing system 126B is coupled to sidewall 110 of the chassis 102. Sidewall 114 has a first end 402 with an aperture 404 formed therein to allow a cooling fluid to enter an internal hollow cavity 406 thereof. An opposing second end 408 of the sidewall 114 is absent of any apertures so that the cooling fluid is caused to flow into inlet(s) (e.g., fluid inlet 202 of FIG. 2) of the circuit card(s) 104 when fully disposed in the chassis. Sidewall 110 has a first end 410 which is absent of any apertures and a second end 412 with an aperture 414 formed therein. Accordingly, the cooling fluid can flow from the circuit card(s) 104 into and through the internal cavity of sidewall 110. The cooling fluid exits the sidewall 110 via the aperture 414.

Figure 5:
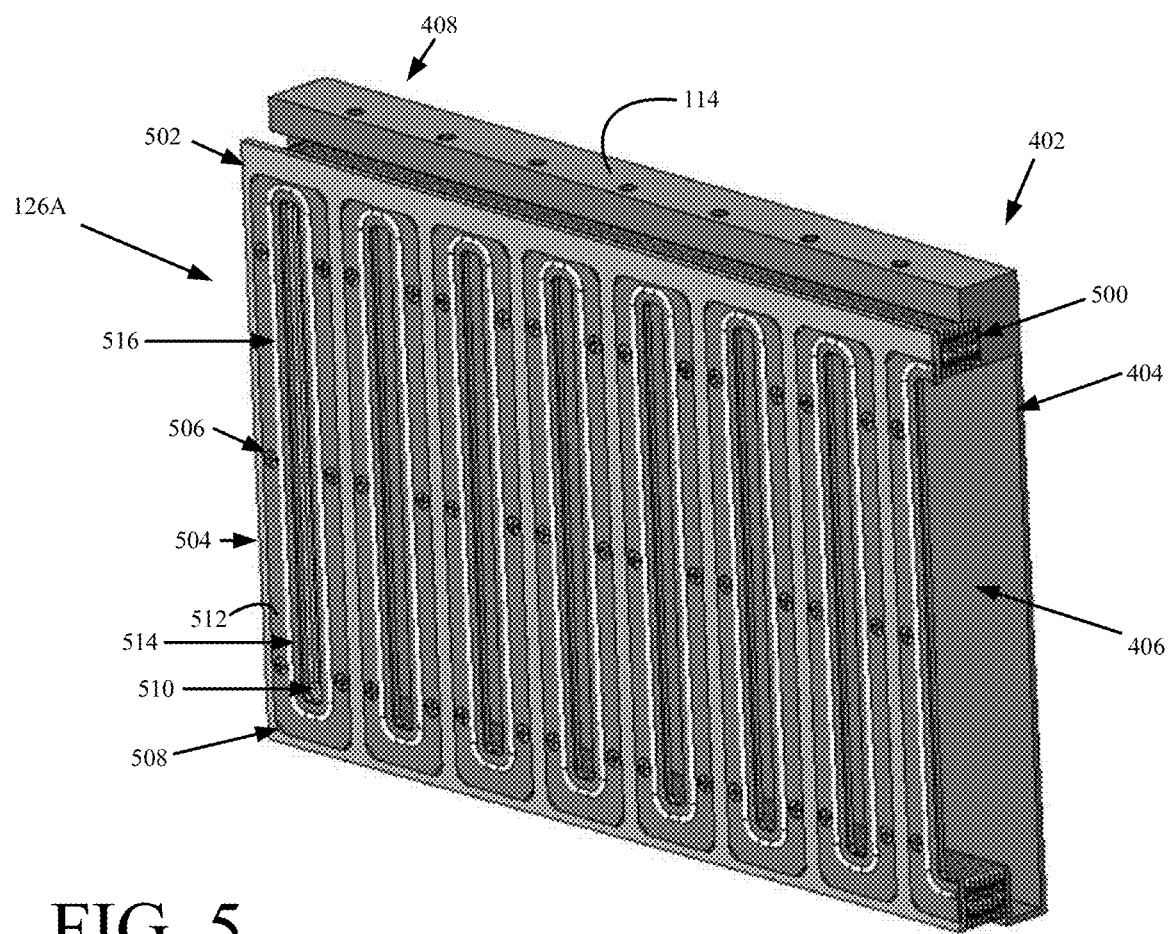
FIG. 5 provides an illustration of a chassis sidewall with a pneumatic release manifold sealing system coupled thereto.
Figure 6:
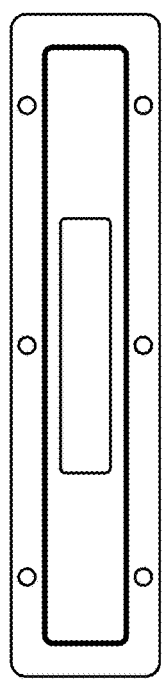
FIGS. 6-9 each provide an illustration of a air flow control plate for a pneumatic release manifold sealing system.
Figure 7:
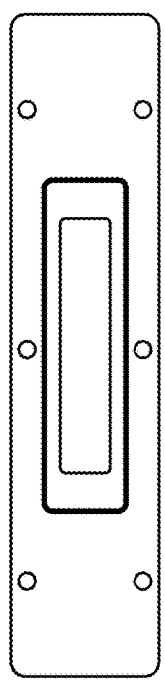

A perspective view of a pneumatic release manifold sealing system 126A coupled to a chassis sidewall 114 is provided in FIG. 5. Pneumatic release manifold sealing system 126B is the same as or similar to pneumatic release manifold sealing system 126A.

The pneumatic release manifold sealing system 126A comprises a bellow 500, a plate 502 and a plurality of fluid flow control members 504 coupled to the plate 502 via couplers 506 (e.g., screws). The bellow 500 is coupled between the chassis sidewall 114 and the pneumatic release manifold sealing system 126A. This coupling can be achieved via an adhesive or other coupling means (e.g., a weld). The bellow 500 can be formed of any suitable material such as metal, rubber or plastic. The bellow 500 is a hollow concertinaed structure with round corners 1000, as more clearly shown in FIG. 10.

The bellow 500 is double walled (e.g., walls 1002, 1004 of FIG. 10) so that a hollow internal cavity (e.g., cavity 1006 of FIG. 10) is provided therein. This cavity is hermetically sealed when the bellow 500 is installed in the chassis (e.g., chassis 102 of FIG. 1). The hermetically sealed cavity of the bellow allows for a vacuum to be used to cause the concertinaed structure to be selectively contracted (or collapsed) via suction of air therefrom. The concertinaed structure expands when the vacuum is disabled or otherwise no longer suctioning air from the internal cavity of the bellow 500. As air re-enters the internal cavity, the concertinaed structure expands.

Figure 10:
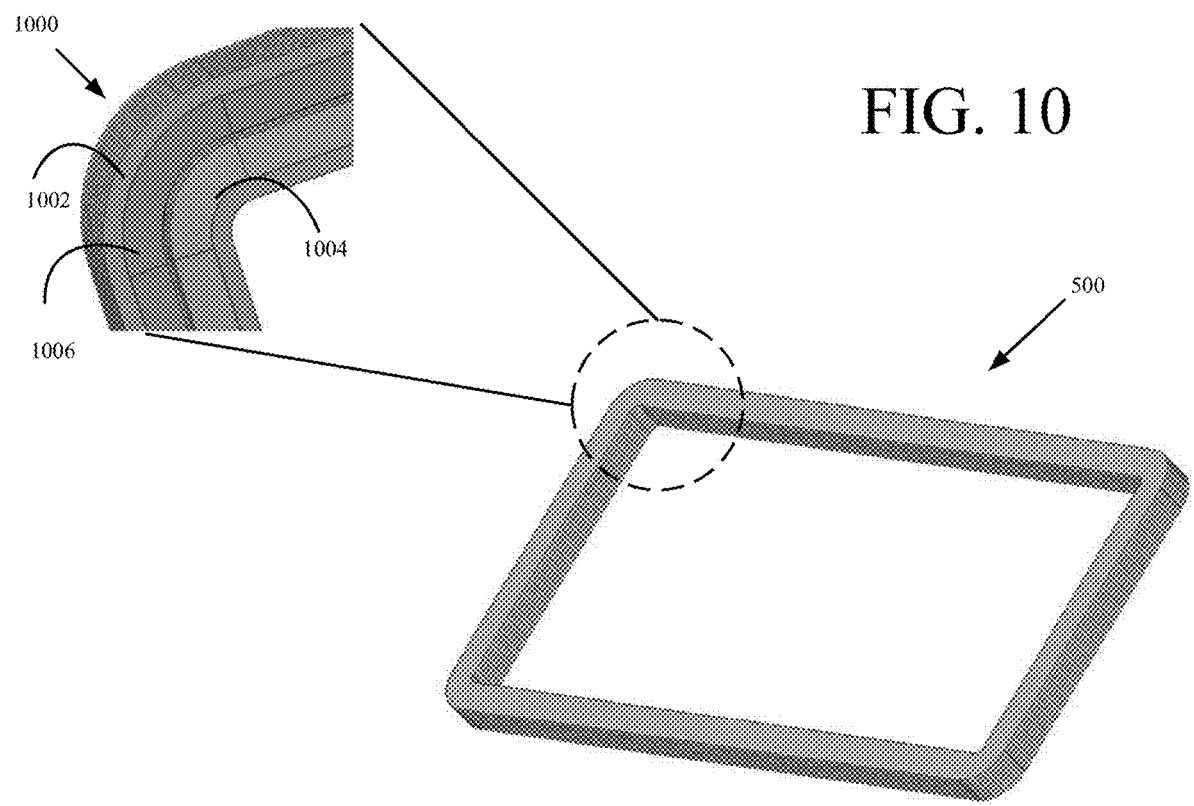
FIG. 10 provides an illustration of a bellow of a pneumatic release manifold sealing system.
Figure 11:
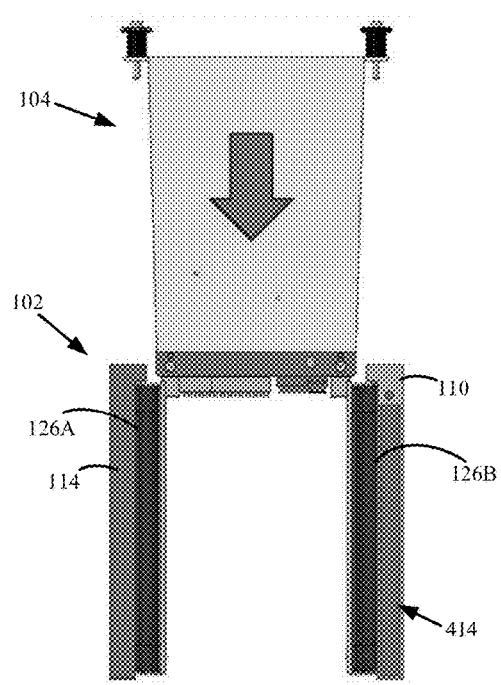
FIGS. 11-13 provide illustration that are useful for understanding how a pneumatic release manifold sealing system operates during insertion of a circuit card into a chassis.

The expansion/contraction facilitates a transition of the bellow 500 between a collapsed state (e.g., shown in FIG. 12) and an expanded state (e.g., as shown in FIGS. 11 and 10). In effect, the bellow 500 generally acts like a resilient member (e.g., a spring) and a duct for containing a fluid (e.g., air). Notably, the amount of expansion/contraction can be the same or different along the concertinaed structure. This feature of the bellow 500 will be discussed further below in relation to FIG. 13. This feature allows the bellow 500 to swivel so that it can conform to the tapered shape of the circuit card sidewalls.

The plate 502 comprises a generally planer structure with recesses 508 formed therein. Each recess 508 is sized and shaped to receive a fluid flow control member 504. An aperture 510 is formed in a sidewall of the recess 508 to facilitate fluid flow from the bellow 500 to a circuit card, when installed in a chassis.

Each fluid flow control member 504 comprises a plate 512 with an aperture 514 formed therein. The aperture 514 is sized and shaped to control an amount of fluid that enters the cooling structure (e.g., cooling structure 218 of FIG. 2) of the circuit card (e.g., circuit card 200 of FIG. 2). In some scenarios, the fluid flow control members can have apertures of the same size and shape as shown in FIG. 5. However, the present solution is not limited in this regard. The fluid flow control members can alternatively have apertures with different sizes and/or shapes.

Figure 8:
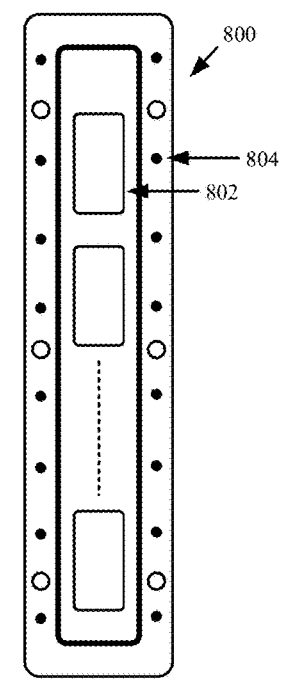
Figure 9:
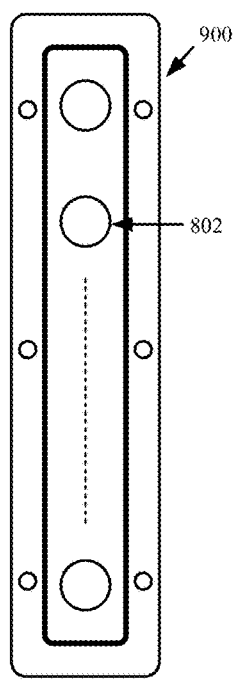

The fluid flow control member 504 may be interchangeable with other fluid flow control members 600, 700, 800, 900 such as those shown in FIGS. 6-9. Fluid flow control member 600 has an aperture 602 which is smaller than aperture 514 of fluid flow control member 504. The smaller aperture 514 allows less fluid to flow from the bellow into a circuit card. Each fluid flow control member 800, 900 has a plurality of apertures 802, 902 rather than one aperture as provided in fluid flow control members 504, 600. The difference between fluid flow control members 800, 900 is that the apertures 802, 902 have different shapes (e.g., generally rectangular vs. circular). Although the same shaped/sized apertures are shown in FIGS. 8 and 9, the present solution is not so limited. A fluid flow control member can have a plurality of different sized and/or shaped apertures.

An elastomeric gasket 516 is coupled to each fluid flow control member 504. The elastomeric gasket 516 provides a means for creating a seal between the fluid flow control member 504 and a circuit card so that the cooling fluid (e.g., air) does not escape while being used to cool the circuit card. The elastomeric gasket 516 is compressed between the fluid flow control member 504 and circuit card via a pushing force applied by the bellow 500 to the plate 502 with a static spring force. Compression of the elastomeric gasket 516 can be limited via one or more compression stops provided with the fluid flow control member 504. The compression stops can be integrated with couplers 506 or comprise other structures (e.g., protrusions 804 of FIG. 8).

Figure 12:
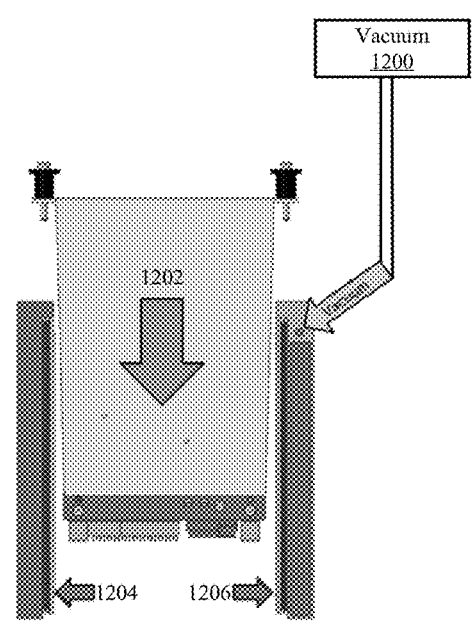
Figure 13:
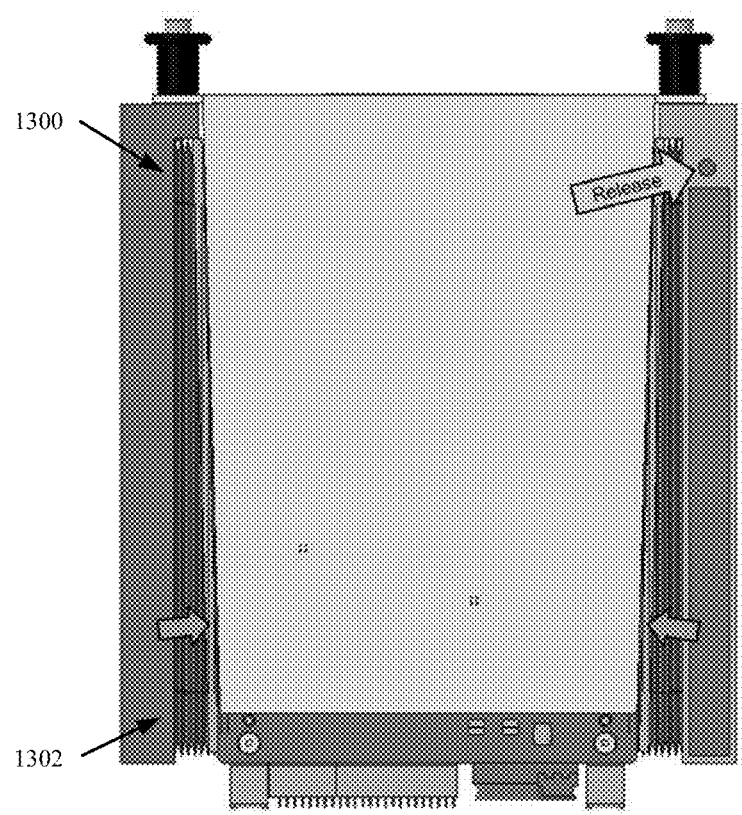

Referring now to FIGS. 11-13, there are provided illustrations that are useful for understanding operations of pneumatic release manifold sealing systems (e.g., pneumatic release manifold sealing system 126A and/or 126A of FIG. 1) disposed in a chassis (e.g., chassis 102 of FIG. 1). The front, back and bottom sidewalls (e.g., sidewalls 112, 116, 118 of FIG. 1) are not shown in FIGS. 11-13 to facilitate ease and clarity of illustration.

Figure 14:
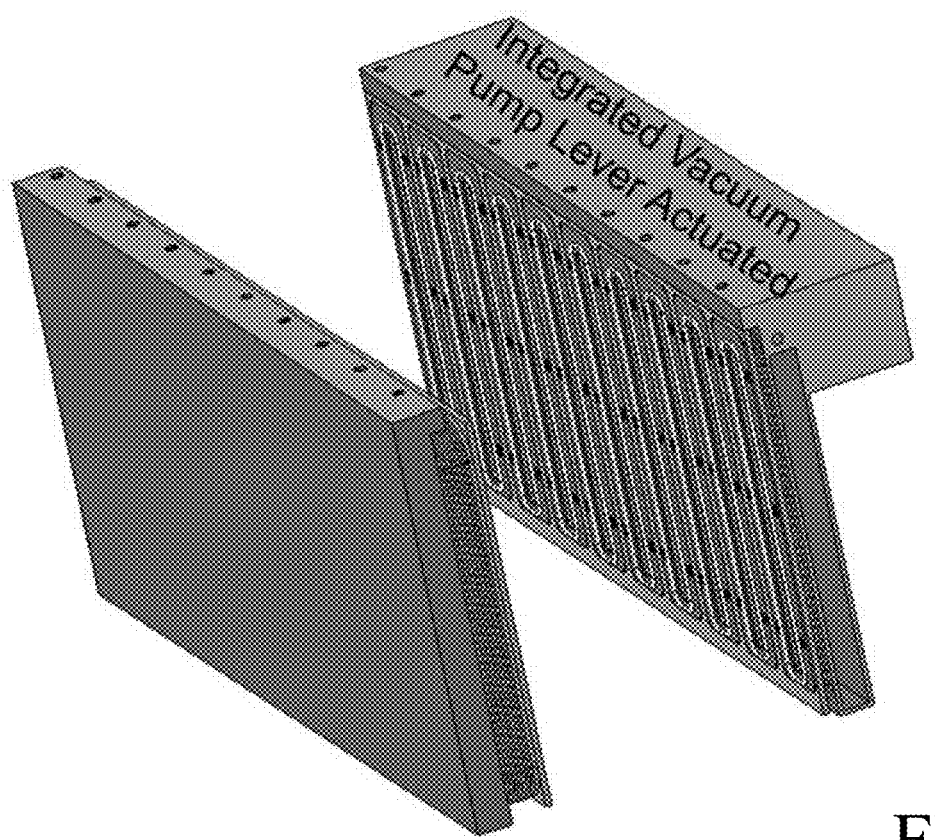
FIG. 14 provides an illustration of a chassis with an integrated vacuum and pump.

In FIG. 11, a circuit card (e.g., circuit card 102 of FIG. 1) is moved in proximity of the chassis. A vacuum 1200 is enabled (or turned on) to cause bellows (e.g., bellow 500 of FIG. 5) of the pneumatic release manifold sealing systems to transition from their expanded states shown in FIG. 11 to their collapsed states shown in FIG. 12. This state transition is illustrated by arrows 1204, 1206 of FIG. 12. The vacuum 1200 may be external to the chassis as shown in FIG. 12 or integrated with the chassis as shown in FIG. 14. Once the bellows are in their collapsed states, the circuit card is inserted into a cavity (e.g., cavity 120 of FIG. 1) of the chassis as shown by arrow 1202 of FIG. 12.

The vacuum 1200 is disabled (or turned off) when the circuit card is fully inserted into the cavity of the chassis. Consequently, the bellows transition from their collapsed state to a partially expanded state shown in FIG. 13. In this partially expanded state, each bellow conforms to the tapered shape of a respective sidewall (e.g., sidewall 308 or 310 of FIG. 3) of the circuit card. Thus, the amount of expansion of the bellow various from top 1300 to bottom 1302.

The bellow applies a pushing force on a plate (e.g., plate 502 of FIG. 5) of the pneumatic release manifold sealing system. The pushing force causes an elastomeric gasket (e.g., elastomeric gasket 516 of FIG. 5) to come in contact with and compress against the tapered sidewall of the circuit card to form a seal between the circuit card and a fluid flow control member (e.g., fluid flow control member 504 of FIG. 5) coupled to the plate of the pneumatic release manifold sealing system. Compression of the elastomeric gasket is limited via one or more compression stops provided with the fluid flow control member. The seal created by the elastomeric gasket may be uniform therealong.

During operation, a cooling fluid (e.g., air) is caused to flow from a first one of the chassis sidewalls (e.g. sidewall 114 of FIG. 1), into the bellow of a first one of the pneumatic release manifold sealing system (e.g., pneumatic release manifold sealing system 126A of FIG. 1), from the bellow into the cooling structure (e.g., cooling structure 218 of FIG. 2) of the circuit card, from the cooling structure of the circuit card into the bellow of a second one of the pneumatic release manifold sealing system (e.g., pneumatic release manifold sealing system 126B of FIG. 1), from the bellow to a second one of the chassis sidewalls (e.g. sidewall 110 of FIG. 1), and out of the second chassis sidewall (e.g., via aperture 414 of FIG. 4). Notably, the elastomeric gaskets of the pneumatic release manifold sealing systems prevent the cooling fluid from escaping while flowing from the first chassis sidewall, through the circuit card, and into the second chassis sidewall. In effect, the cooling fluid effectively cools the circuit card during use thereof.

It should be noted that the present solution can be used with circuit cards other than those described herein with tapered sidewalls. For example, the present solution is also used with circuit cards with straight rather than non-tapered sidewalls that contact the elastomeric gaskets.

Figure 15:
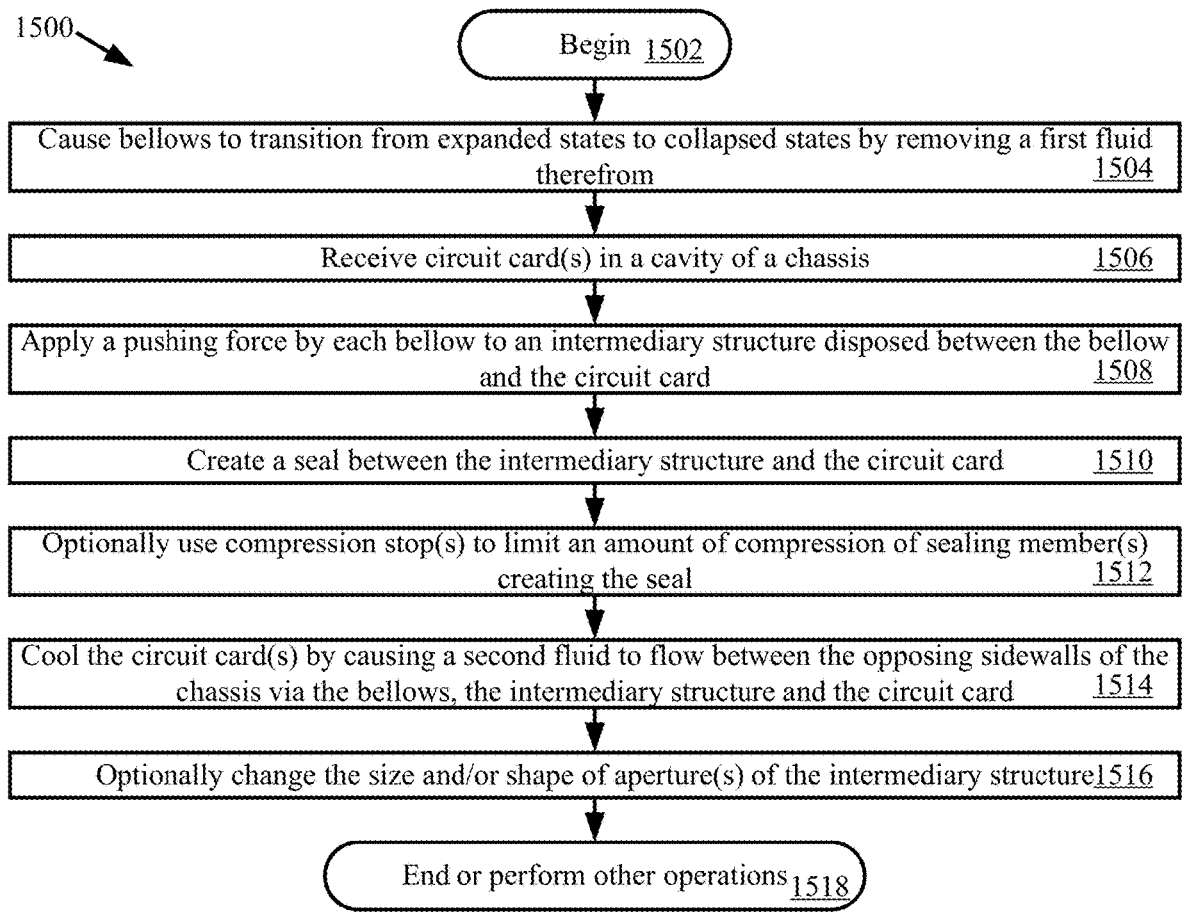
FIG. 15 provides a flow diagram of a method for operating a chassis such that circuit card(s) is (are) inserted, retained and cooled therein.

Referring now to FIG. 15, there is provided a flow diagram of a method 1500 for operating a chassis such that circuit card(s) is(are) inserted, retained and cooled therein. Method 1500 begins with 1502 and continues with 1504 where bellows (e.g., bellow 500 of FIG. 5) are caused to transition from expanded states (e.g., as shown in FIG. 11) to collapsed states (e.g., as shown in FIG. 12) by removing a first fluid (e.g., air) therefrom. A vacuum (e.g., vacuum 1200 of FIG. 12) can be used to facilitate the removal of the first fluid from the bellows. The bellows are coupled to opposing sidewalls (e.g., sidewalls 110, 114 of FIG. 1) of a chassis (e.g., chassis 102 of FIG. 1). The chassis is configured to structurally support at least one circuit card (e.g., circuit card 104 of FIG. 1).

In 1506, the circuit card(s) is(are) received in a cavity (e.g., cavity 120 of FIG. 1) of the chassis. Next in 1508, the bellows are caused to transition from the collapsed states to at least partially expanded states (e.g., as shown in FIG. 13) by allowing the first fluid to enter the bellows. This can be facilitated by disabling (or turning off) the vacuum. Each bellow applies a pushing force in 1508 to an intermediary structure (e.g., structure 502, 504 of FIG. 5) disposed between the bellow and the circuit card. As a result, a seal is created in 1510 between the intermediary structure and the circuit card. This seal is created (or otherwise formed) and maintained when the bellow is in the at least partially expanded state. In 1512, compression stop(s) (e.g., compression stop(s) 506 of FIGS. 5 and/or 804 of FIG. 8) is(are) optionally used to limit an amount of compression of sealing member(s) creating the seal.

In some scenarios, the circuit card(s) has(have) tapered sidewall(s) (e.g., sidewall(s) 308, 310 of FIG. 3). Each bellow has an amount of expansion that varies from a first end (e.g., end 1300 of FIG. 13) to a second opposing end (e.g., end 1302 of FIG. 13) when in the at least partially expanded state. The variation in the amount of expansion is at least partially caused by a tapered sidewall(s) of the circuit card(s). The present solution is not limited to the particulars of these scenarios. For example, when the circuit card(s) has(have) non-tapered sidewalls, each bellow has an amount of expansion that does not vary from the first end (e.g., end 1300 of FIG. 13) to the second opposing end (e.g., end 1302 of FIG. 13) when in the at least partially expanded state. Non-tapered circuit card architectures are well known.

In 1514, circuit card(s) is(are) cooled. This cooling is achieved by causing a second fluid to flow between the opposing sidewalls of the chassis via the bellows, the intermediary structure and the circuit card(s) in the manner described above. The intermediary structure comprises aperture(s) (e.g., aperture(s) 514 of FIG. 5) through which a first amount of the second fluid can flow. The size or shape of the aperture(s) can be optionally changed in 1516 to allow a different second amount of the second fluid to flow through the intermediary structure. For example, in some scenarios, the intermediary structure comprises interchangeable fluid flow control members (e.g., fluid flow control member(s) 504 of FIG. 5, 600 of FIG. 6, 700 of FIG. 7, 800 of FIGS. 8 and/or 900 of FIG. 9). One or more of the fluid flow control members can be selected and coupled to a plate to form the intermediary structure. The fluid flow control members have first apertures. The fluid flow control member(s) can be replaced with another fluid flow control member that has a second aperture with (i) a shape or size different than a shape or size of the first aperture and/or (ii) a plurality of second apertures. The present solution is not limited to the particulars of this example. Subsequently, 1518 is performed where method 1500 ends or other operations are performed (e.g., return to 1502).

The described features, advantages and characteristics disclosed herein may be combined in any suitable manner. One skilled in the relevant art will recognize, in light of the description herein, that the disclosed systems and/or methods can be practiced without one or more of the specific features. In other instances, additional features and advantages may be recognized in certain scenarios that may not be present in all instances.

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

I claim:

1. A method, comprising:
   causing bellows to transition from expanded states to collapsed states by removing a first fluid therefrom, the bellows being coupled to opposing sidewalls of a chassis configured to structurally support at least one circuit card;
   receiving the at least one circuit card in a cavity of the chassis;
   causing the bellows to transition from the collapsed states to at least partially expanded states by allowing the first fluid to enter the bellows;
   applying a pushing force by each said bellow to an intermediary structure disposed between the bellow and the circuit card;
   creating a seal between the intermediary structure and the circuit card when the bellow is in the at least partially expanded state; and
   cooling the at least one circuit card by causing a second fluid to flow between the opposing sidewalls of the chassis via the bellows, the intermediary structure and the at least one circuit card.

2. The method according to claim 1, wherein the first fluid is removed from the bellows using a vacuum.

3. The method according to claim 1, wherein the intermediary structure comprises at least one aperture through which a first amount of the second fluid can flow.

4. The method according to claim 1, further comprising changing a size or shape of the at least one aperture to allow a different second amount of the second fluid to flow through the intermediary structure.

5. A method, comprising:
   causing bellows to transition from expanded states to collapsed states by removing a first fluid therefrom, the bellows being coupled to opposing sidewalls of a chassis configured to structurally support at least one circuit card;
   receiving the at least one circuit card in a cavity of the chassis;
   causing the bellows to transition from the collapsed states to at least partially expanded states by allowing the first fluid to enter the bellows;
   applying a pushing force by each said bellow to an intermediary structure disposed between the bellow and the circuit card;
   creating a seal between the intermediary structure and the circuit card when the bellow is in the at least partially expanded state; and
   coupling at least one fluid flow control member to a plate to form the intermediary structure, the at least one fluid flow control member having a first aperture.

6. The method according to claim 5, further comprising replacing the at least one fluid flow control member with another fluid flow control member that has a second aperture with a shape or size different than a shape or size of the first aperture.

7. The method according to claim 5, further comprising replacing the at least one fluid flow control member with another fluid flow control member that has a plurality of second apertures.

8. A method, comprising:
   causing bellows to transition from expanded states to collapsed states by removing a first fluid therefrom, the bellows being coupled to opposing sidewalls of a chassis configured to structurally support at least one circuit card;
   receiving the at least one circuit card in a cavity of the chassis;
   causing the bellows to transition from the collapsed states to at least partially expanded states by allowing the first fluid to enter the bellows;
   applying a pushing force by each said bellow to an intermediary structure disposed between the bellow and the circuit card;
   creating a seal between the intermediary structure and the circuit card when the bellow is in the at least partially expanded state; and using at least one compression stop of the intermediary structure to limit an amount of compression of an elastomeric gasket creating the seal.

9. A method, comprising:
causing bellows to transition from expanded states to collapsed states by removing a first fluid therefrom, the bellows being coupled to opposing sidewalls of a chassis configured to structurally support at least one circuit card;
receiving the at least one circuit card in a cavity of the chassis;
causing the bellows to transition from the collapsed states to at least partially expanded states by allowing the first fluid to enter the bellows;
applying a pushing force by each said bellow to an intermediary structure disposed between the bellow and the circuit card;
creating a seal between the intermediary structure and the circuit card when the bellow is in the at least partially expanded state; and
wherein each said bellow has an amount of expansion that varies from a first end to a second opposing end when in the at least partially expanded state, variation in the amount of expansion being caused by a tapered sidewall of the at least one circuit card.

10. An electronic cooling apparatus, comprising:
a chassis having a plurality of sidewalls defining a cavity in which at least one circuit card is receivable; and
at least one pneumatic release manifold sealing system comprising:
a bellow having a first side coupled to a sidewall of the plurality of sidewalls and configured to (i) transition from an expanded state to a collapsed state via removal of a first fluid therefrom and (ii) transition from the collapsed state to the expanded state when the first fluid is no longer being removed therefrom;
an intermediary structure coupled to a second side of the bellow such that the bellow is able to apply a pushing force on the intermediary structure when transitioning from the collapsed state; and
a sealing member configured to create a seal between the intermediary structure and the at least one circuit card as the bellow is transitioning from the collapsed state;
a fan configured to cause a second fluid to flow from the sidewall and through the bellow, the intermediary structure and the at least one circuit card.

11. The electronic cooling apparatus according to claim 10, wherein the first fluid is removed from the bellow using a vacuum.

12. The electronic cooling apparatus according to claim 10, wherein the intermediary structure comprises at least one aperture through which a first amount of the second fluid can flow.

13. The electronic cooling apparatus according to claim 10, wherein a size or shape of the at least one aperture is changeable to allow a different second amount of the second fluid to flow through the intermediary structure.

14. The electronic cooling apparatus according to claim 10, further comprising at least one compression stop configured to limit an amount of compression of the sealing member when creating the seal.

15. An electronic cooling apparatus, comprising:
a chassis having a plurality of sidewalls defining a cavity in which at least one circuit card is receivable; and
at least one pneumatic release manifold sealing system comprising:
a bellow having a first side coupled to a sidewall of the plurality of sidewalls and configured to (i) transition from an expanded state to a collapsed state via removal of a first fluid therefrom and (ii) transition from the collapsed state to the expanded state when the first fluid is no longer being removed therefrom;
an intermediary structure coupled to a second side of the bellow such that the bellow is able to apply a pushing force on the intermediary structure when transitioning from the collapsed state; and
a sealing member configured to create a seal between the intermediary structure and the at least one circuit card as the bellow is transitioning from the collapsed state;
wherein the intermediary structure comprises a plate with at least one fluid flow control member coupled thereto, the at least one fluid flow control member having a first aperture.

16. The electronic cooling apparatus according to claim 15, wherein the at least one fluid flow control member is replaceable by at least one other fluid flow control member that has a second aperture with a shape or size different than a shape or size of the first aperture.

17. The electronic cooling apparatus according to claim 15, wherein the at least one fluid flow control member is replaceable by at least one other fluid flow control member that has a plurality of second apertures.

18. An electronic cooling apparatus, comprising:
a chassis having a plurality of sidewalls defining a cavity in which at least one circuit card is receivable; and
at least one pneumatic release manifold sealing system comprising:
a bellow having a first side coupled to a sidewall of the plurality of sidewalls and configured to (i) transition from an expanded state to a collapsed state via removal of a first fluid therefrom and (ii) transition from the collapsed state to the expanded state when the first fluid is no longer being removed therefrom;
an intermediary structure coupled to a second side of the bellow such that the bellow is able to apply a pushing force on the intermediary structure when transitioning from the collapsed state; and
a sealing member configured to create a seal between the intermediary structure and the at least one circuit card as the bellow is transitioning from the collapsed state;
wherein the bellow has an amount of expansion that varies from a first end to a second opposing end when in an at least partially expanded state.

* * * * *